US012658929B2

(12) United States Patent
Na

(10) Patent No.: US 12,658,929 B2
(45) Date of Patent: Jun. 16, 2026

(54) PHASE DETECTION CIRCUIT, AND CLOCK GENERATION CIRCUIT AND METHOD USING THE SAME

(71) Applicant: SK hynix Inc., Icheon-si (KR)

(72) Inventor: Han Sol Na, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 70 days.

(21) Appl. No.: 18/916,089

(22) Filed: Oct. 15, 2024

(65) Prior Publication Data

US 2026/0019086 A1     Jan. 15, 2026

(30) Foreign Application Priority Data

Jul. 11, 2024     (KR) ......................... 10-2024-0091556

(51) Int. Cl.
*H03L 7/083*          (2006.01)
*H03L 7/081*          (2006.01)
*H03L 7/191*          (2006.01)
(52) U.S. Cl.
CPC ............ *H03L 7/191* (2013.01); *H03L 7/0818* (2013.01); *H03L 7/083* (2013.01)

(58) Field of Classification Search
CPC ........ H03L 7/0818; H03L 7/083; H03L 7/191
USPC ................................. 327/156, 158, 291, 299
See application file for complete search history.

(56) References Cited

U.S. PATENT DOCUMENTS

| | | | |
|---|---|---|---|
| 6,518,807 B1 * | 2/2003 | Cho ........................ | H03L 7/087 |
| | | | 327/158 |
| 10,637,488 B1 * | 4/2020 | Im ........................... | H03L 7/089 |
| 10,979,057 B1 | 4/2021 | Sun et al. | |
| 2005/0195663 A1 * | 9/2005 | Kwak ..................... | H03L 7/087 |
| | | | 365/194 |
| 2021/0335403 A1 * | 10/2021 | Choi ...................... | G11C 7/225 |

* cited by examiner

*Primary Examiner* — William Hernandez
(74) *Attorney, Agent, or Firm* — WILLIAM PARK AND ASSOCIATES LTD.

(57)               ABSTRACT

A clock generation circuit performs a delay-locked operation on a reference clock signal. The clock generation circuit is configured to perform the delay-locked operation by comparing the phases of a division reference clock signal and a feedback clock signal. After the delay-locked operation is completed, the clock generation circuit is configured to selectively invert the phase of the division reference clock signal by comparing the phases of the division reference clock signal and the delay feedback clock signal.

20 Claims, 6 Drawing Sheets

200

PHASE DETECTION CIRCUIT, AND CLOCK GENERATION CIRCUIT AND METHOD USING THE SAME

CROSS-REFERENCES TO RELATED APPLICATION

The present application claims priority under 35 U.S.C. § 119(a) to Korean Patent Application No. 10-2024-0091556, filed in the Korean Intellectual Property Office on Jul. 11, 2024, the entire contents of which application is incorporated herein by reference.

BACKGROUND

1. Technical Field

Various embodiments relate to an integrated circuit technology, and more particularly, to a phase detection circuit, and a clock generation circuit and method using the same.

2. Related Art

An electronic device includes many electronic components. Among the electronic components, a computer system may include many semiconductor devices composed of a semiconductor. The semiconductor devices that constitute the computer system may communicate with each other by transmitting and receiving a system clock signal, such as an external clock signal, and data. The semiconductor devices may operate in synchronization with the clock signal. The semiconductor device may generate an internal clock signal from the system clock signal in order to synchronize its operation timing with that of an external device or secure an operation margin and may include a clock generation circuit that generates the internal clock signal.

The clock generation circuit may perform a delay-locked operation in order to compensate for the time during which the system clock signal is delayed within the semiconductor device. The clock generation circuit may divide the frequency of the system clock signal in order to reduce the time and power consumption for the delay-locked operation and may perform the delay-locked operation based on a division clock signal. However, if the internal clock signal is generated by performing the delay-locked operation based on the division clock signal, the phase of the internal clock signal may be synchronized with a rising edge of the division clock signal but may also be synchronized with a falling edge of the division clock signal. When the phase of the internal clock signal is synchronized with the falling edge of the division clock signal, the operation reliability of the semiconductor device may be degraded because a harmonic lock occurs.

SUMMARY

In an embodiment, a phase detection circuit may include a division circuit, a clock selection circuit, a phase detector group, and an edge detector. The division circuit may be configured to generate a first division clock signal and a second division clock signal by dividing a reference clock signal. The clock selection circuit may be configured to output one of the first and second division clock signals as a division reference clock signal based on an edge detection signal. The phase detector group may be configured to generate a phase detection signal by comparing phases of the division reference clock signal and a feedback clock signal.

The edge detector may be configured to generate the edge detection signal by comparing a phase of a delay feedback clock signal that is generated by delaying the feedback clock signal and the phase of the division reference clock signal.

In an embodiment, a clock generation circuit may include a delay line, a first division circuit, a second division circuit, a delay model circuit, a phase detection circuit, and a delay control circuit. The delay line may be configured to generate a delay clock signal by delaying a reference clock signal based on a first delay control signal and a second delay control signal. The first division circuit may be configured to generate an output clock signal by dividing a frequency of the delay clock signal. The second division circuit may be configured to generate a division output clock signal by dividing a frequency of the output clock signal. The delay model circuit may be configured to generate a feedback clock signal by delaying the division output clock signal by a modeled delay time. The phase detection circuit may be configured to generate a division reference clock signal by dividing the reference clock signal, to generate a first phase detection signal by comparing phases of the division reference clock signal and the feedback clock signal during a first delay-locked operation, to generate a second phase detection signal by comparing the phases of the division reference clock signal and the feedback clock signal during a second delay-locked operation, and to selectively invert the phase of the division reference clock signal based on the division reference clock signal and the feedback clock signal after the first delay-locked operation is completed. The delay control circuit may be configured to generate a first delay control signal based on the first phase detection signal and configured to generate a second delay control signal based on the second phase detection signal.

In an embodiment, a clock generation method may include generating a division reference clock signal by dividing a reference clock signal. The method may include performing a first delay-locked operation by delaying a phase of the reference clock signal by comparing phases of the division reference clock signal and the feedback clock signal. And the method may include selectively inverting, when the first delay-locked operation is completed, the phase of the division reference clock signal by comparing a phase of a delay feedback clock signal, which is generate by delaying the feedback clock signal, and the phase of the division reference clock signal.

DETAILED DESCRIPTION

Figure 1:
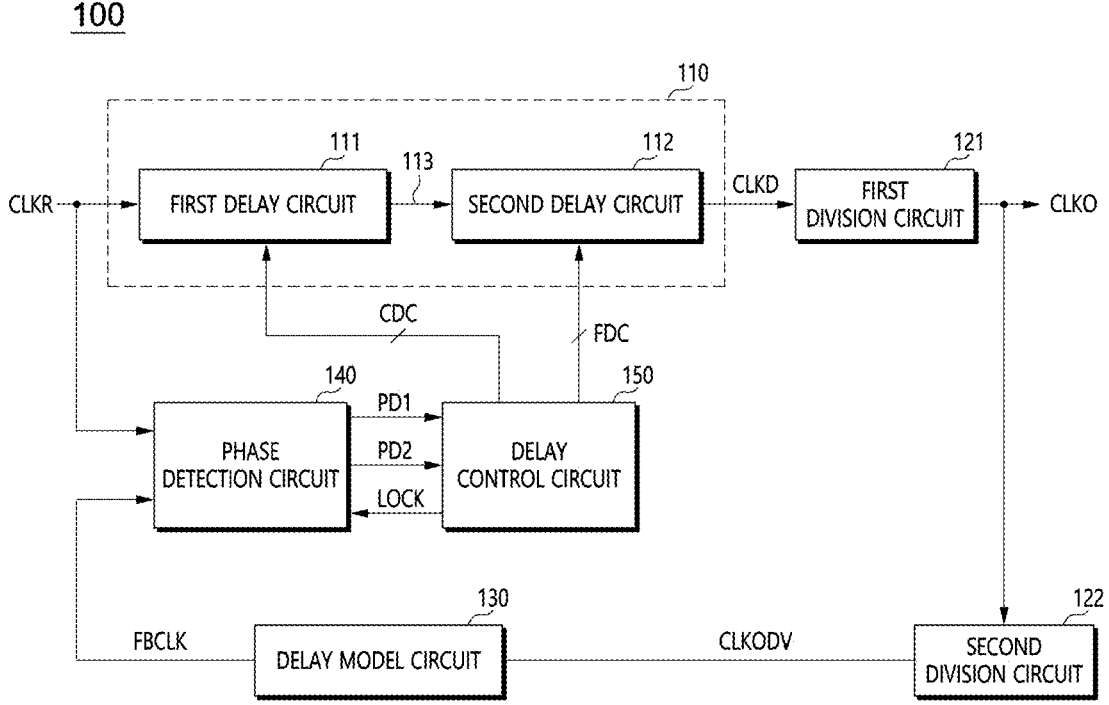
FIG. 1 is a diagram illustrating a configuration of a clock generation circuit according to an embodiment.

FIG. 1 is a diagram illustrating a configuration of a clock generation circuit 100 according to an embodiment. Referring to FIG. 1, the clock generation circuit 100 may receive a reference clock signal CLKR and may generate an output clock signal CLKO based on the reference clock signal CLKR. The clock generation circuit 100 may generate the output clock signal CLKO by performing a delay-locked operation on the reference clock signal CLKR. The clock generation circuit 100 may be a delay-locked loop circuit that performs a delay-locked operation on the reference clock signal CLKR. The clock generation circuit 100 may generate the output clock signal CLKO, having a lower frequency than the reference clock signal CLKR, by dividing the frequency of the reference clock signal CLKR. For example, the frequency of the output clock signal CLKO may be ½ of the frequency of the reference clock signal CLKR. As the frequency of a system clock signal of a semiconductor device that includes the clock generation circuit 100 is increased, the frequency of the reference clock signal CLKR may be increased. If the frequency of the reference clock signal CLKR is increased and a delay-locked operation is performed on a clock signal having a high frequency, because resolution of the delay-locked loop circuit is reduced and a delay time is inevitably frequently updated, the operation reliability of the clock generation circuit may be degraded and power consumption thereof may be increased. The clock generation circuit 100 may perform a delay-locked operation by using a clock division method in order to perform an accurate delay-locked operation and reduce power consumption. If the delay-locked operation is performed on a clock signal having a low frequency, resolution of the delay-locked loop circuit may be increased, and an interval in which a delay time is updated may be optimized. The clock generation circuit 100 may perform a first delay-locked operation and a second delay-locked operation in order to generate the output clock signal CLKO from the reference clock signal CLKR. The clock generation circuit 100 may preferentially perform the first delay-locked operation and may perform the second delay-locked operation after the first delay-locked operation is completed. A unit delay amount by which the reference clock signal CLKR is delayed during the first delay-locked operation may be greater than a unit delay amount by which the reference clock signal CLKR is delayed during the second delay-locked operation. The first delay-locked operation may be a coarse delay-locked operation. The second delay-locked operation may be a fine delay-locked operation.

The clock generation circuit 100 may include a delay line 110, a first division circuit 121, a second division circuit 122, a delay model circuit 130, a phase detection circuit 140, and a delay control circuit 150. The delay line 110 may receive the reference clock signal CLKR and may generate a delay clock signal CLKD by delaying the reference clock signal CLKR. The delay line 110 may receive a delay control signal CDC and FDC and may have a delay time that varies based on the delay control signal CDC and FDC. The delay line 110 may include a first delay circuit 111 and a second delay circuit 112. The first delay circuit 111 may receive the reference clock signal CLKR and may delay the reference clock signal CLKR. The second delay circuit 112 may receive an output signal 113 of the first delay circuit 111 and may generate the delay clock signal CLKD by delaying the output signal 113. The delay control signal CDC and FDC may include a first delay control signal CDC and a second delay control signal FDC. The first delay circuit 111 may receive the first delay control signal CDC. The delay time of the first delay circuit 111 may be changed based on the first delay control signal CDC. The first delay circuit 111 may delay the reference clock signal CLKR by a set delay time based on the first delay control signal CDC. The second delay circuit 112 may receive the second delay control signal FDC. The delay time of the second delay circuit 112 may be changed based on the second delay control signal FDC. The second delay circuit 112 may delay the output signal 113 by a set delay time based on the second delay control signal FDC. A first unit delay time of the first delay circuit 111 may be longer than a second unit delay time of the second delay circuit 112. The unit delay time may be a delay time and/or a delay amount that may be changed in one cycle. For example, the first delay-locked operation may be performed for a plurality of cycles. The delay time of the first delay circuit 111 may be changed by the first unit delay time for each cycle. The second delay-locked operation may be performed for a plurality of cycles. The delay time of the second delay circuit 112 may be changed by the second unit delay time for each cycle.

The first delay control signal CDC may be a digital signal having a plurality of bits. The first delay circuit 111 may be a digitally-controlled delay circuit. The first delay circuit 111 may include a plurality of delay cells that are electrically coupled in series and may variably delay the reference clock signal CLKR by adjusting the number of delay cells that is activated based on the logic value of the first delay control signal CDC. A delay time by one delay cell may correspond to the first unit delay time. The second delay control signal FDC may be a digital signal having a plurality of bits. The second delay circuit 112 may be a digitally-controlled phase mixing circuit. For example, the first delay circuit 111 may output a signal having a phase that is later than the phase of the output signal 113 by a first unit delay time, along with the output signal 113. The second delay circuit 112 may generate the delay clock signal CLKD having a phase that is between the phase of the output signal 113 and the phase of the signal having the late phase. The second delay circuit 112 may variably delay the output signal 113 of the first delay circuit 111 by changing a phase weight and/or driver intensity based on the logic value of the second delay control signal FDC. Whenever the phase weight and/or the driver intensity is changed for each step, the delay time of the second delay circuit 112 may be changed by the second unit delay time.

The first division circuit 121 may generate the output clock signal CLKO by receiving the delay clock signal CLKD from the delay line 110. The first division circuit 121 may generate the output clock signal CLKO by dividing the frequency of the delay clock signal CLKD. The first division circuit 121 may generate the output clock signal CLKO by dividing the delay clock signal CLKD into two. The frequency of the output clock signal CLKO may be ½ of the frequency of the delay clock signal CLKD. The first division circuit 121 may include any clock divider capable of generating an output clock signal having a lower frequency than an input clock signal.

The second division circuit 122 may generate a division output clock signal CLKODV by receiving the output clock signal CLKO from the first division circuit 121. The second division circuit 122 may generate the division output clock signal CLKODV by dividing the frequency of the output clock signal CLKO. The second division circuit 122 may generate the division output clock signal CLKODV by dividing the output clock signal CLKO into two. The frequency of the division output clock signal CLKODV may be ½ of the frequency of the output clock signal CLKO. Accordingly, the frequency of the division output clock signal CLKODV may be ¼ of the frequency of the reference clock signal CLKR and/or the delay clock signal CLKD.

The second division circuit 122 may include any clock divider capable of generating an output clock signal having a lower frequency than an input clock signal. The second division circuit 122 may have substantially the same configuration as the first division circuit 121 except for the input signal and the output signal.

The delay model circuit 130 may receive the division output clock signal CLKODV from the second division circuit 122. The delay model circuit 130 may generate a feedback clock signal FBCLK by delaying the division output clock signal CLKODV. The delay time of the delay model circuit 130 may be arbitrarily set. The delay model circuit 130 may have a fixed delay time. In an embodiment, most of a total delay time, delayed by the delay model circuit 130, may be a locked-delay time. The remainder of the total delay time may be a variable delay time. The delay model circuit 130 may have a delay time that imitates and/or models a propagation delay that occurs in a path along which the reference clock signal CLKR is transmitted in a semiconductor device including the clock generation circuit 100, the delay time being a modeled delay time. The feedback clock signal FBCLK may have a phase that is later than the phase of the output clock signal CLKO by the delay time of the delay model circuit 130. The frequency of the feedback clock signal FBCLK may be ½ of the frequency of the output clock signal CLKO and may be ¼ of the frequency of the reference clock signal CLKR and/or the delay clock signal CLKD.

The phase detection circuit 140 may receive the reference clock signal CLKR and the feedback clock signal FBCLK. The phase detection circuit 140 may generate a phase detection signal PD1 and PD2 based on the reference clock signal CLKR and the feedback clock signal FBCLK. The phase detection circuit 140 may generate the phase detection signal PD1 and PD2 by comparing the phases of the reference clock signal CLKR and the feedback clock signal FBCLK. The phase detection circuit 140 may generate a division reference clock signal by dividing the frequency of the reference clock signal CLKR. The phase detection circuit 140 may generate the division reference clock signal by dividing the reference clock signal CLKR into two. The frequency of the division reference clock signal may be ½ of the frequency of the reference clock signal CLKR. The phase detection circuit 140 may generate the phase detection signal PD1 and PD2 by comparing the phases of the division clock signal and the feedback clock signal FBCLK. The phase detection signal PD1 and PD2 may include a first phase detection signal PD1 and a second phase detection signal PD2. The phase detection circuit 140 may perform a first phase detection operation during the first delay-locked operation and may perform the second phase detection operation during the second delay-locked operation. The phase detection circuit 140 may generate the first phase detection signal PD1 by comparing the phases of the division reference clock signal and the feedback clock signal FBCLK during the first delay-locked operation. The phase detection circuit 140 may generate the second phase detection signal PD2 by comparing the phases of the division reference clock signal and the feedback clock signal FBCLK during the second delay-locked operation. Before performing the second delay-locked operation and/or the second phase detection operation and after the first delay-locked operation and/or the first phase detection operation is completed, the phase detection circuit 140 may selectively invert the phase of the division reference clock signal based on the feedback clock signal FBCLK and the division reference clock signal. The phase detection circuit 140 may generate a delay feedback clock signal by delaying the feedback clock signal FBCLK. After the first delay-locked operation and/or the first phase detection operation is completed, the phase detection circuit 140 may invert the phase of the division reference clock signal by comparing the phases of the delay feedback clock signal and the division reference clock signal. The phase detection circuit 140 may further receive a locking signal LOCK. When the locking signal LOCK is enabled, the phase detection circuit 140 may selectively invert the phase of the division reference clock signal by comparing the phases of the delay feedback clock signal and the division reference clock signal.

The delay control circuit 150 may receive the phase detection signal PD1 and PD2 from the phase detection circuit 140 and may generate the delay control signal CDC and FDC based on the phase detection signal PD1 and PD2. The delay control circuit 150 may change the logic value of the delay control signal CDC and FDC based on the logic level of the phase detection signal PD1 and PD2. The delay control circuit 150 may generate the first delay control signal CDC based on the first phase detection signal PD1. The delay control circuit 150 may change the logic value of the first delay control signal CDC based on the logic level of the first phase detection signal PD1. The delay control circuit 150 may generate the second delay control signal FDC based on the second phase detection signal PD2. The delay control circuit 150 may change the logic value of the second delay control signal FDC based on the logic level of the second phase detection signal PD2. In an embodiment, the delay control circuit 150 may include an average filter or a moving average filter. For example, when a phase detection signal having a first logic level is generated more often than a phase detection signal having a second logic level a threshold number of times or more, the delay control circuit 150 including the average filter may increase or decrease the logic value of the delay control signal CDC and FDC based on the phase detection signal having the first logic level. When a phase detection signal having the same logic level is consecutively generated a threshold number of times or more, the delay control circuit 150 including the moving average filter may increase or decrease the logic value of the delay control signal CDC and FDC based on the phase detection signal having the same logic level. The delay control circuit 150 may generate the locking signal LOCK based on the first phase detection signal PD1 during the first delay-locked operation. When generating the locking signal LOCK, the delay control circuit 150 may fix the logic value of the first delay control signal CDC and may terminate the first delay-locked operation. For example, after the first phase detection signal PD1 having the first logic level is consecutively generated, when the first phase detection signal PD1 having the second logic level is generated, the delay control circuit 150 may detect that the reference clock signal and the feedback clock signal are in-phase and may enable the locking signal LOCK. In an embodiment, when the first phase detection signal PD1 having the first logic level and the first phase detection signal PD1 having the second logic level are alternately generated, the delay control circuit 150 may enable the locking signal LOCK. The delay control circuit 150 may provide the locking signal LOCK to the phase detection circuit 140. The locking signal LOCK may be a coarse locking signal that is generated when the first delay-locked operation is completed. Although not illustrated, the delay control circuit 150 may separately generate a fine locking signal when the second delay-locked operation is completed.

Figure 2:
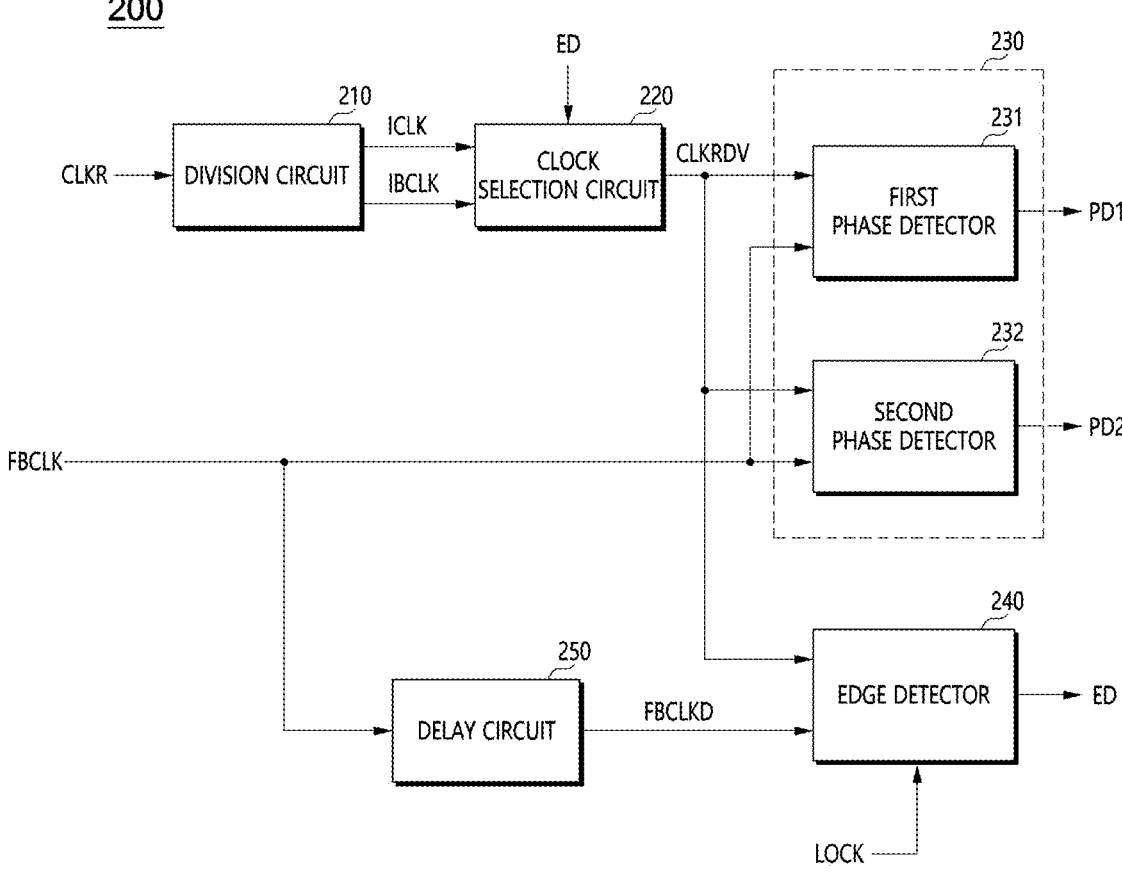
FIG. 2 is a diagram illustrating a configuration of a phase detection circuit according to an embodiment.

FIG. 2 is a diagram illustrating a configuration of a phase detection circuit 200 according to an embodiment. The phase detection circuit 200 may be applied as the phase detection circuit 140 of FIG. 1. In FIG. 2, the phase detection circuit 200 may be illustrated as receiving the same signals as and generating the same output signals as the phase detection circuit 140 of FIG. 1. Referring to FIG. 2, the phase detection circuit 200 may receive the reference clock signal CLKR and the feedback clock signal FBCLK and may generate the phase detection signal PD1 and PD2 based on the reference clock signal CLKR and the feedback clock signal FBCLK. The phase detection circuit 200 may generate the division reference clock signal CLKRDV by dividing the reference clock signal CLKR and may generate the phase detection signal PD1 and PD2 by comparing the phases of the division reference clock signal CLKRDV and the feedback clock signal FBCLK. The phase detection circuit 200 may perform the first phase detection operation and the second phase detection operation. The phase detection circuit 200 may initially perform the first phase detection operation and may perform the second phase detection operation after the first phase detection operation is terminated. The phase detection circuit 200 may generate the first phase detection signal PD1 by comparing the phases of the division reference clock signal CLKRDV and the feedback clock signal FBCLK during the first phase detection operation. During the second phase detection operation, the phase detection circuit 200 may generate the second phase detection signal PD2 by comparing the phases of the division reference clock signal CLKRDV and the feedback clock signal FBCLK. The phase detection circuit 200 may generate the delay feedback clock signal FBCLKD by delaying the feedback clock signal FBCLK. The phase detection circuit 200 may selectively invert the phase of the division reference clock signal CLKRDV by comparing the phases of the delay feedback clock signal FBCLKD and the division reference clock signal CLKRDV. After the first phase detection operation is terminated, the phase detection circuit 200 may compare the phases of the delay feedback clock signal FBCLKD and the division reference clock signal CLKRDV. The phase detection circuit 200 may receive the locking signal LOCK, compare the phases of the delay feedback clock signal FBCLKD and the division reference clock signal CLKRDV when the locking signal LOCK is enabled, and invert the phase of the division reference clock signal CLKRDV based on the result of the comparison.

The phase detection circuit 200 may include a division circuit 210, a clock selection circuit 220, a phase detector group 230, and an edge detector 240. The division circuit 210 may receive the reference clock signal CLKR and may generate a first division clock signal ICLK and a second division clock signal IBCLK based on the reference clock signal CLKR. The division circuit 210 may generate the first and second division clock signals ICLK and IBCLK by dividing the frequency of the reference clock signal CLKR. For example, the division circuit 210 may generate the first and second division clock signals ICLK and IBCLK by dividing the reference clock signal CLKR into two. The frequency of each of the first and second division clock signals ICLK and IBCLK may be ½ of the frequency of the reference clock signal CLKR. The second division clock signal IBCLK may have a phase that is opposite to and/or complementary to the phase of the first division clock signal ICLK. For example, the first division clock signal ICLK may have a phase that is synchronized with an odd-numbered rising edge of the reference clock signal CLKR. The second division clock signal IBCLK may have a phase that is synchronized with an even-numbered rising edge of the reference clock signal CLKR.

The clock selection circuit 220 may receive the first and second division clock signals ICLK and IBCLK from the division circuit 210. The clock selection circuit 220 may receive an edge detection signal ED from the edge detector 240. Based on the edge detection signal ED, the clock selection circuit 220 may generate the division reference clock signal CLKRDV from the first and second division clock signals ICLK and IBCLK. Based on the edge detection signal ED, the clock selection circuit 220 may generate the division reference clock signal CLKRDV from one of the first and second division clock signals ICLK and IBCLK. When the edge detection signal ED is disabled, the clock selection circuit 220 may output the first division clock signal ICLK as the division reference clock signal CLKRDV. The division reference clock signal CLKRDV may have substantially the same phase as the first division clock signal ICLK. When the edge detection signal ED is enabled, the clock selection circuit 220 may output the second division clock signal IBCLK as the division reference clock signal CLKRDV. The division reference clock signal CLKRDV may have substantially the same phase as the second division clock signal IBCLK. Accordingly, when the edge detection signal ED is enabled, the clock selection circuit 220 may select one of the division clock signals as the division reference clock signal CLKRDV and may invert the phase of the division reference clock signal CLKRDV.

The phase detector group 230 may receive the division reference clock signal CLKRDV and the feedback clock signal FBCLK. The phase detector group 230 may generate the phase detection signal PD1 and PD2 by comparing the phases of the division reference clock signal CLKRDV and the feedback clock signal FBCLK. The phase detector group 230 may generate the first phase detection signal PD1 by comparing the phases of the division reference clock signal CLKRDV and the feedback clock signal FBCLK during the first phase detection operation. The phase detector group 230 may generate the second phase detection signal PD2 by comparing the phases of the division reference clock signal CLKRDV and the feedback clock signal FBCLK during the second phase detection operation. The phase detector group 230 may include a first phase detector 231 and a second phase detector 232. The first phase detector 231 may receive the division reference clock signal CLKRDV and the feedback clock signal FBCLK. The first phase detector 231 may generate the first phase detection signal PD1 by comparing the phases of the division reference clock signal CLKRDV and the feedback clock signal FBCLK. For example, the first phase detector 231 may generate the first phase detection signal PD1 by detecting the voltage level of the division reference clock signal CLKRDV at a rising edge of the feedback clock signal FBCLK. The second phase detector 232 may receive the division reference clock signal CLKRDV and the feedback clock signal FBCLK. The second phase detector 232 may generate the second phase detection signal PD2 by comparing the phases of the division clock signal CLKRDV and the feedback clock signal FBCLK. For example, the second phase detector 232 may generate the second phase detection signal PD2 by detecting the voltage level of the division reference clock signal CLKRDV at a rising edge of the feedback clock signal FBCLK.

Based on the feedback clock signal FBCLK and the division reference clock signal CLKRDV, the edge detector 240 may generate the edge detection signal ED. The edge detector 240 may receive the division reference clock signal CLKRDV and may receive the delay feedback clock signal FBCLKD that is generated by delaying the feedback clock signal FBCLK. The phase detection circuit 200 may further include a delay circuit 250. The delay circuit 250 may receive the feedback clock signal FBCLK and may generate the delay feedback clock signal FBCLKD by delaying the feedback clock signal FBCLK. The delay circuit 250 may delay the feedback clock signal FBCLK by a preset delay time. The preset delay time may be arbitrarily set according to the designer's intention. The delay time of the delay circuit 250 may be preferably shorter than the time corresponding to half the cycle of the division reference clock signal CLKRDV. The edge detector 240 may generate the edge detection signal ED by comparing the phases of the delay feedback clock signal FBCLKD and the division reference clock signal CLKRDV. The edge detector 240 may generate the edge detection signal ED by detecting the logic level of the division reference clock signal CLKRDV at a rising edge of the delay feedback clock signal FBCLKD. The edge detector 240 may disable the edge detection signal ED when the division reference clock signal CLKRDV is at a first logic level at a rising edge of the delay feedback clock signal FBCLKD. The edge detector 240 may enable the edge detection signal ED when the division reference clock signal CLKRDV is at a second logic level at a rising edge of the delay feedback clock signal FBCLKD. For example, the first logic level may be a logic high level, and the second logic level may be a logic low level. The edge detector 240 may further receive the locking signal LOCK. The edge detector 240 may be activated when the locking signal LOCK is enabled and may compare the phases of the delay feedback clock signal FBCLKD and the division reference clock signal CLKRDV.

Figure 3:
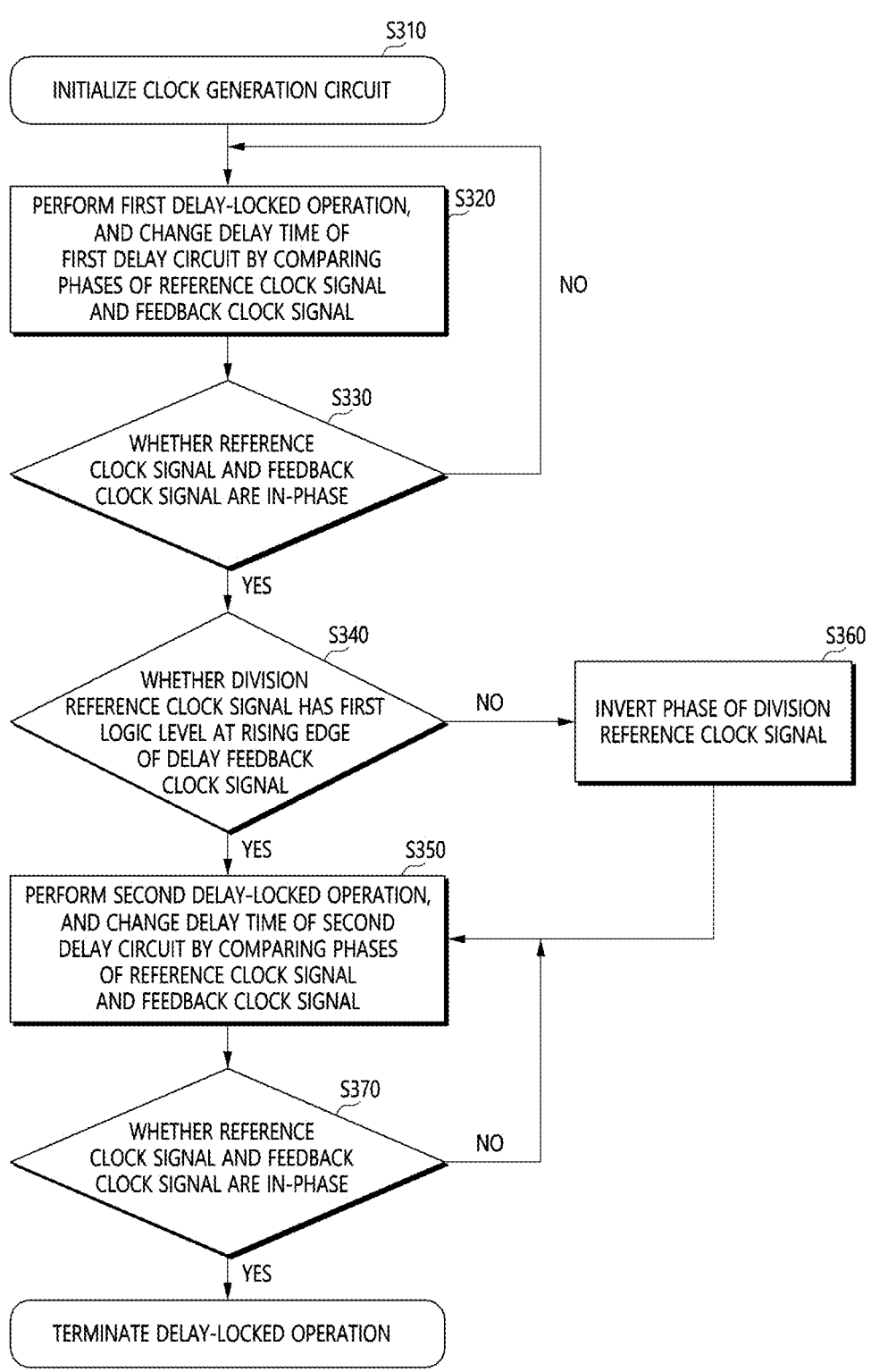
FIG. 3 is a flowchart illustrating operations of the clock generation circuit and the phase detection circuit according to an embodiment.

FIG. 3 is a flowchart illustrating operations of the clock generation circuit 100 and the phase detection circuit 200 according to an embodiment. An operation of the clock generation circuit 100 according to an embodiment is described as follows with reference to FIGS. 1 to 3. In S310, the clock generation circuit 100 may be initialized. The clock generation circuit 100 may be initialized when a semiconductor device including the clock generation circuit 100 is powered up or the mode of the semiconductor device is changed from a low power mode to an active mode. In an embodiment, the clock generation circuit 100 may be initialized periodically or aperiodically while the semiconductor device is being maintained in the active mode. After the start of the initialization operation, the delay control circuit 150 may set the logic values of the first and second delay control signals CDC and FDC as a default value. The delay time of each of the first and second delay circuits 111 and 112 may be set as a default delay time. In the phase detection circuit 200, the edge detection signal ED may maintain a disabled state. The clock selection circuit 220 may output the first division clock signal ICLK as the division reference clock signal CLKRDV. After the clock generation circuit 100 is initialized, S320 may be performed. In S320, the clock generation circuit 100 may perform the first delay-locked operation. During the first delay-locked operation, the clock generation circuit 100 may change the delay time of the first delay circuit 111 by comparing the phases of the reference clock signal CLKR and the feedback clock signal FBCLK. The phase detection circuit 200 may generate the first phase detection signal PD1 by comparing the phases of the division reference clock signal CLKRDV and the feedback clock signal FBCLK. The delay control circuit 150 may change the logic value of the first delay control signal CDC based on the first phase detection signal PD1. The delay time of the first delay circuit 111 may be changed based on the logic value of the first delay control signal CDC. In S330, the clock generation circuit 100 may determine whether the reference clock signal CLKR and the feedback clock signal FBCLK are in-phase. When the result of S330 is "No", S320 and S330 may be repeatedly performed. S320 and S330 may be performed for one cycle. The first delay-locked operation may be performed for a plurality of cycles. In S330, after the first phase detection signal PD1 having a first logic level is consecutively generated, when the first phase detection signal PD1 having a second logic level is generated, the clock generation circuit 100 may determine that the reference clock signal CLKR and the feedback clock signal FBCLK are in-phase. When the result of S330 is "Yes", the first delay-locked operation may be completed. The delay control circuit 150 may maintain the logic value of the first delay control signal CDC and may enable the locking signal LOCK.

When the first delay-locked operation is completed, S340 may be performed. In S340, the phase detection circuit 200 may determine whether the division reference clock signal CLKRDV has the first logic level at a rising edge of the delay feedback clock signal FBCLKD. When the locking signal LOCK is enabled, the edge detector 240 may generate the edge detection signal ED by comparing the phases of the delay feedback clock signal FBCLKD and the division reference clock signal CLKRDV. When the division reference clock signal CLKRDV is at the first logic level (i.e., the result of S340 is "Yes") at the rising edge of the delay feedback clock signal FBCLKD, the edge detector 240 may maintain the edge detection signal ED in a disabled state. The clock selection circuit 220 may continue to output the first division clock signal ICLK as the division reference clock signal CLKRDV. The phase of the division reference clock signal CLKRDV may be maintained without any change, and S350 may be performed. When the division reference clock signal CLKRDV is at the second logic level (i.e., the result of S340 is "No") at the rising edge of the delay feedback clock signal FBCLKD, the edge detector 240 may enable the edge detection signal ED, and S360 may be performed. In S360, the phase detection circuit 200 may invert the phase of the division reference clock signal CLKRDV. The clock selection circuit 220 may invert the phase of the division reference clock signal CLKRDV by outputting the second division clock signal IBCLK, instead of the first division clock signal ICLK, as the division reference clock signal CLKRDV based on the edge detection signal ED. After the phase of the division reference clock signal CLKRDV is inverted, S350 may be performed.

Figure 4A:
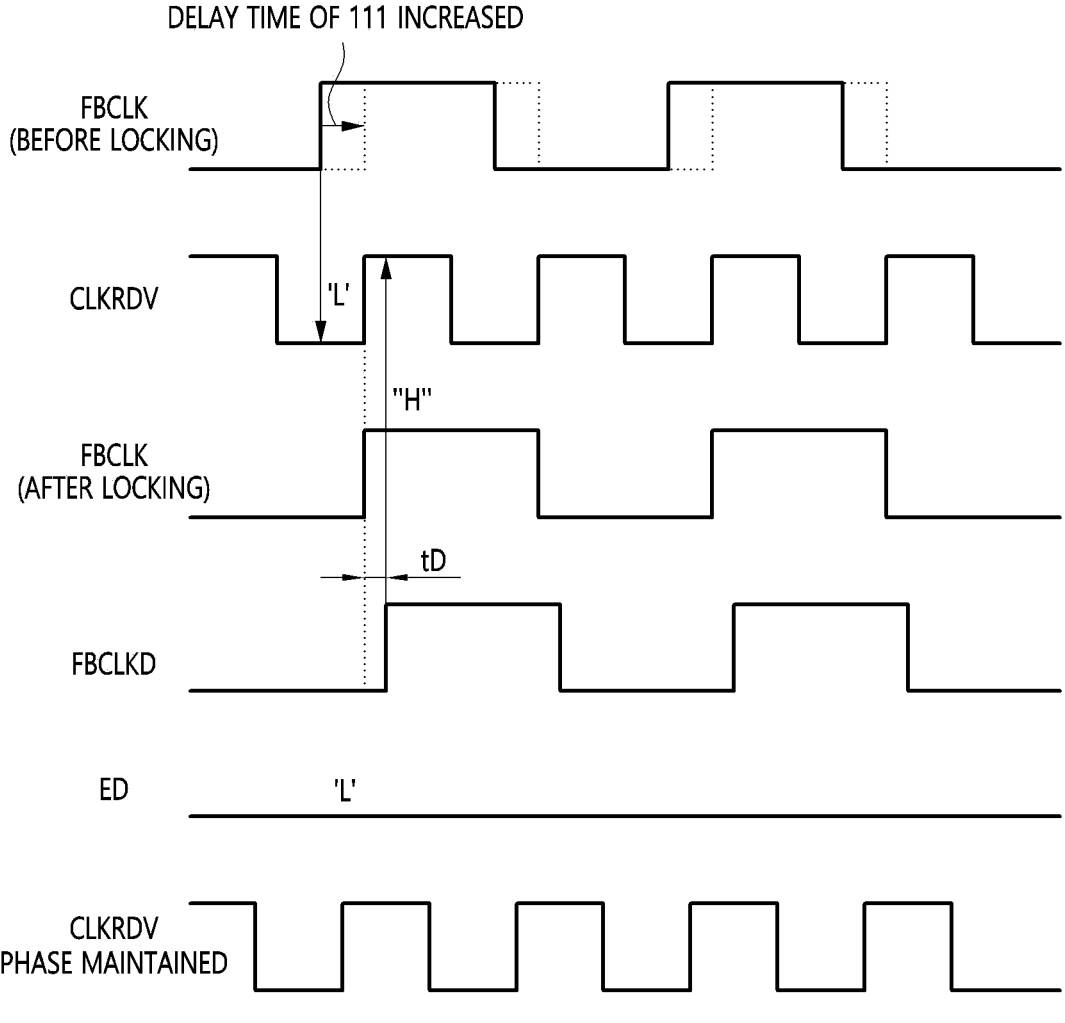
FIGS. 4A and 4B are timing diagrams illustrating operations of the clock generation circuit and the phase detection circuit according to an embodiment.
Figure 4B:
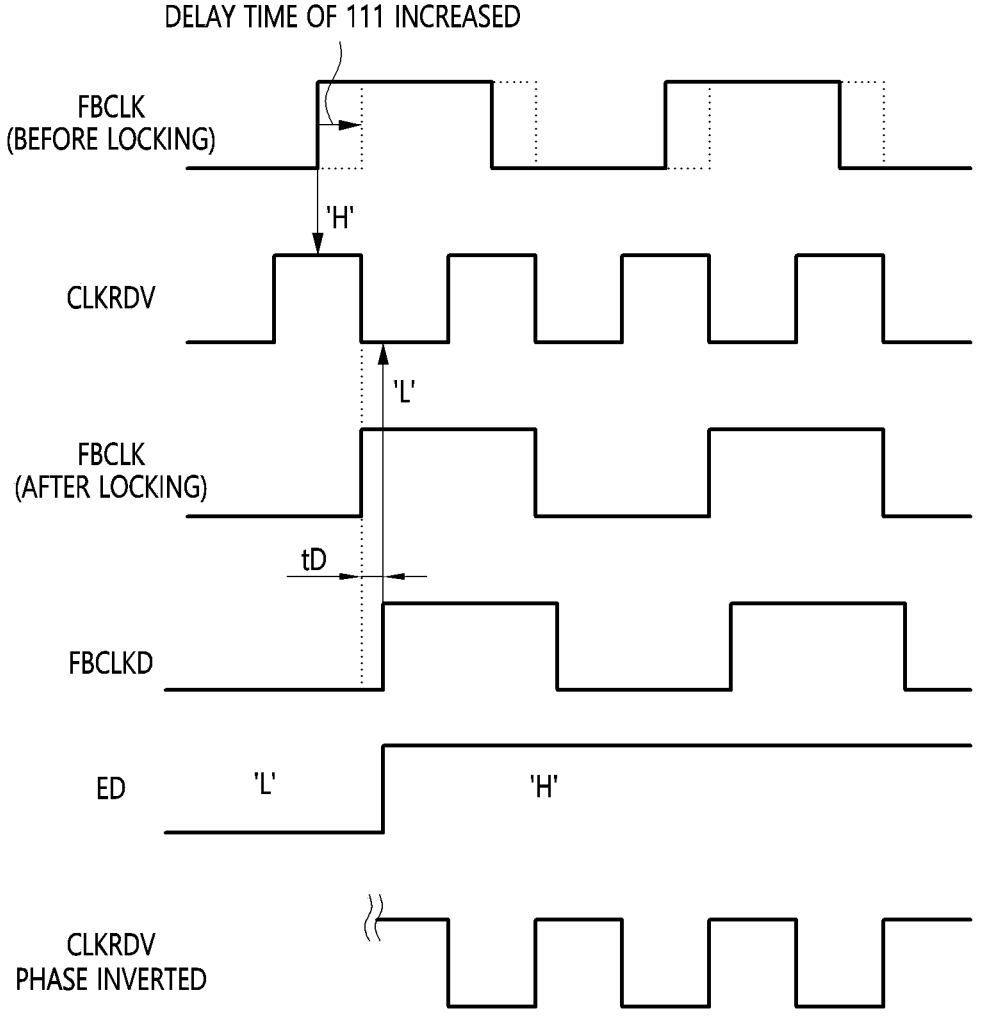

FIGS. 4A and 4B are timing diagrams illustrating operations of the clock generation circuit 100 and the phase detection circuit 200 according to an embodiment. S320, S330, S340, and S360 are described more specifically as follows with reference to FIGS. 4A and 4B. When the phase detection signal having the second logic level is generated after the phase detection signal having any one logic level is continuously generated during the first delay-locked operation, the delay control circuit 150 may terminate the first delay-locked operation and may generate the locking signal LOCK. FIG. 4A may illustrate a case in which the phase of the feedback clock signal FBCLK has been delayed and locked based on a rising edge of the division reference clock signal CLKRDV. When a rising edge of the feedback clock signal FBCLK is present in the logic low level interval of the division reference clock signal CLKRDV at a time point at which the clock generation circuit 100 is initialized, the delay control circuit 150 may increase the delay time of the first delay circuit 111. As the delay time of the first delay circuit 111 is increased in stages, the phase of the feedback clock signal FBCLK may be delayed in stages. The delay control circuit 150 may enable the locking signal LOCK at a time point at which a rising edge of the division reference clock signal CLKRDV occurs simultaneously with a rising edge of the feedback clock signal FBCLK or occurs earlier than a rising edge of the feedback clock signal FBCLK. When the locking signal LOCK is enabled, the edge detector 240 may detect the phases of the delay feedback clock signal FBCLKD, which has been delayed from the feedback clock signal FBCLK by the preset delay time tD (i.e., the delay time of the delay circuit 250), and the division reference clock signal CLKRDV. As the division reference clock signal CLKRDV is at a logic high level at the rising edge of the delay feedback clock signal FBCLKD, the edge detector 240 may maintain the edge detection signal ED in a disabled state (i.e., a logic low level). The clock selection circuit 220 may maintain the phase of the division reference clock signal CLKRDV by continuously outputting the first division clock signal ICLK as the division reference clock signal CLKRDV.

FIG. 4B may illustrate a case in which the phase of the feedback clock signal FBCLK is delayed and locked based on a falling edge of the division reference clock signal CLKRDV. When the phase of the feedback clock signal FBCLK is delayed and locked based on a falling edge of the division reference clock signal CLKRDV, a harmonic lock may occur, and the phase of the output clock signal CLKO may differ from the phase of the reference clock signal CLKR by an integer multiple of the cycle of the reference clock signal CLKR. In general, when a harmonic lock occurs, after detecting that the phase of the feedback clock signal FBCLK has been delayed and locked based on a falling edge of the division reference clock signal CLKRDV, the division circuit 210 may need to be reset or the division reference clock signal CLKRDV may need to be generated again. Accordingly, if the division circuit 210 is reset or a division method of the division circuit 210 is changed, a full rate margin point may occur, the delay-locked time of the clock generation circuit may be increased, and a malfunction of the clock generation circuit may easily occur in a situation in which the frequency of the clock signal is high or power noise occurs. The full rate margin point may mean that a time loss corresponding to about 1 cycle of the reference clock signal CLKR occurs while changing the division method of the division circuit 210. The clock generation circuit and the phase detection circuit according to an embodiment can efficiently solve the harmonic lock while reducing the delay-locked time without the full rate margin point. When a rising edge of the feedback clock signal FBCLK is present in the logic high level interval of the division reference clock signal CLKRDV at a time point at which the clock generation circuit 100 is initialized, the delay control circuit 150 may increase the delay time of the first delay circuit 111. As the delay time of the first delay circuit 111 is increased in stages, the phase of the feedback clock signal FBCLK may be delayed in stages. The delay control circuit 150 may enable the locking signal LOCK at a time point at which a falling edge of the division reference clock signal CLKRDV occurs simultaneously with a rising edge of the feedback clock signal FBCLK or occurs earlier than a rising edge of the feedback clock signal FBCLK. When the locking signal LOCK is enabled, the edge detector 240 may detect the phases of the delay feedback clock signal FBCLKD, which has been delayed from the feedback clock signal FBCLK by the preset delay time tD (i.e., the delay time of the delay circuit 250), and the division reference clock signal CLKRDV. The edge detector 240 may enable the edge detection signal ED because the division reference clock signal CLKRDV is at a logic low level at the rising edge of the delay feedback clock signal FBCLKD. The clock selection circuit 220 may select the second division clock signal IBCLK, instead of the first division clock signal ICLK, as the division reference clock signal CLKRDV and may invert the phase of the division reference clock signal CLKRDV based on the edge detection signal ED. When the locking signal LOCK is enabled, the phase of the division reference clock signal CLKRDV may be immediately maintained or inverted based on the result of a comparison between the phases of the delay feedback clock signal FBCLKD and the division reference clock signal CLKRDV. Accordingly, the phase detection circuit 200 may rarely generate a time loss in order to solve the harmonic lock.

Referring back to FIG. 3, in S350, the clock generation circuit 100 may perform the second delay-locked operation. During the second delay-locked operation, the clock generation circuit 100 may change the delay time of the second delay circuit 112 by comparing the phases of the reference clock signal CLKR and the feedback clock signal FBCLK. The phase detection circuit 200 may generate the second phase detection signal PD2 by comparing the phases of the division reference clock signal CLKRDV and the feedback clock signal FBCLK. The delay control circuit 150 may change the logic value of the second delay control signal FDC based on the second phase detection signal PD2. The delay time of the second delay circuit 112 may be changed based on the logic value of the second delay control signal FDC. In S370, the clock generation circuit 100 may determine whether the reference clock signal CLKR and the feedback clock signal FBCLK are in-phase. When the result of S370 is "No", S350 and S370 may be repeatedly performed. S350 and S360 may be performed for one cycle. The second delay-locked operation may be performed for a plurality of cycles. In S370, after the second phase detection signal PD2 having a first logic level is consecutively generated, when the second phase detection signal PD2 having a second logic level is generated, the clock generation circuit 100 may determine that the reference clock signal CLKR and the feedback clock signal FBCLK are in-phase. When the result of S370 is "Yes", the second delay-locked operation may be completed. The delay control circuit 150 may maintain the logic value of the second delay control signal FDC, and the delay-locked operation of the clock generation circuit 100 may be terminated.

Figure 5:
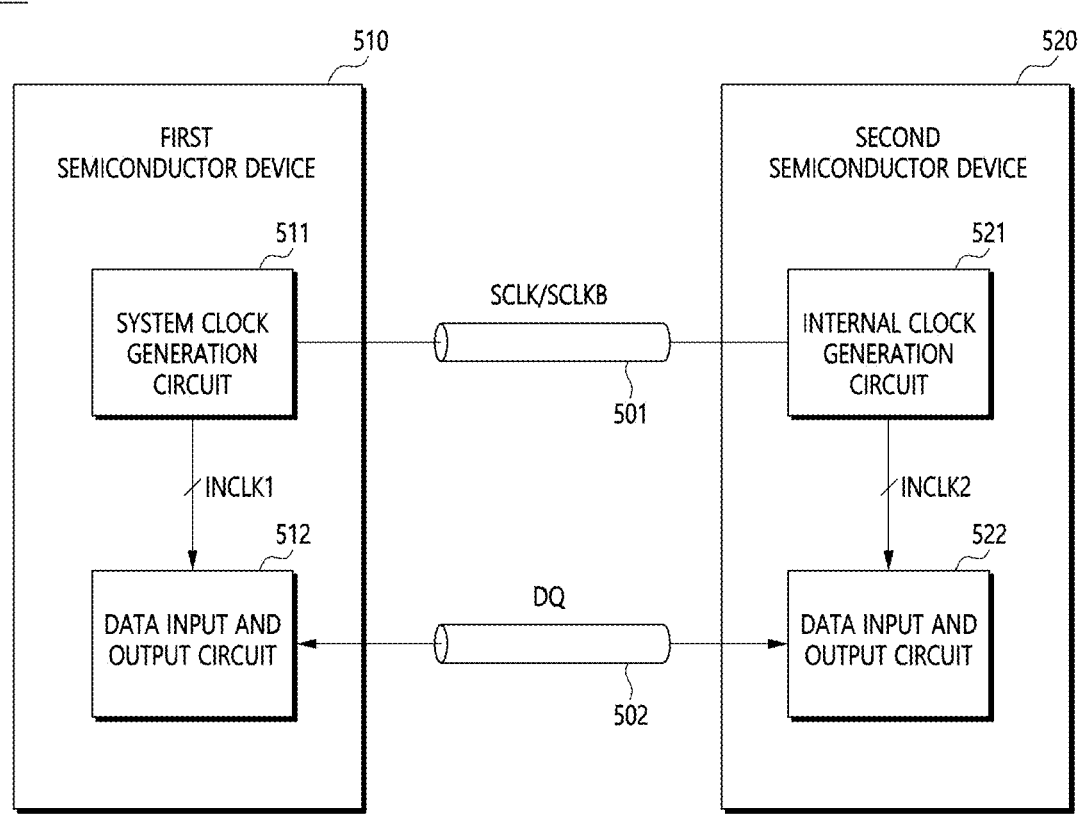
FIG. 5 is a diagram illustrating configurations of semiconductor devices and a semiconductor system according to an embodiment.

FIG. 5 is a diagram illustrating a configuration of a semiconductor system 500 according to an embodiment. Referring to FIG. 5, the semiconductor system 500 may include a first semiconductor device 510 and a second semiconductor device 520. The first semiconductor device 510 may provide various control signals that are necessary for the second semiconductor device 520 to operate. The first semiconductor device 510 may include various types of host devices. For example, the first semiconductor device 510 may include at least one of a central processing unit (CPU), a graphic processing unit (GPU), a multi-media processor (MMP), a digital signal processor, an application processor (AP), and a memory controller. The second semiconductor device 520 may be a memory device, for example. The memory device may include volatile memory and nonvolatile memory. The volatile memory may include static RAM (SRAM), dynamic RAM (DRAM), and synchronous DRAM (SDRAM). The nonvolatile memory may include read only memory (ROM), programmable ROM (PROM), electrically erasable programmable ROM (EEPROM), electrically programmable ROM (EPROM), flash memory, phase change RAM (PRAM), magnetic RAM (MRAM), resistive RAM (RRAM), and ferroelectric RAM (FRAM).

The second semiconductor device 520 may be electrically coupled to the first semiconductor device 510 through a plurality of buses. The plurality of buses may be a signal transmission path, link, or channel for transmitting a signal. The plurality of buses may include a clock bus 501 and a data bus 502. The clock bus 501 may be a unidirectional bus. The data bus 502 may be a bidirectional bus. Although not illustrated, the semiconductor system 500 may further include a command bus and an address bus for transmitting a command signal and an address signal from the first semiconductor device 510 to the second semiconductor device 520. The second semiconductor device 520 may be electrically coupled to the first semiconductor device 510 through the clock bus 501 and may receive a system clock signal SCLK through the clock bus 501. The system clock signal SCLK may be transmitted as a single-ended signal and may be transmitted as a differential signal along with a complementary system clock signal SCLKB. The second semiconductor device 520 may be electrically coupled to the first semiconductor device 510 through the data bus 502 and may receive data DQ from the first semiconductor device 510 or transmit the data DQ to the first semiconductor device 510 through the data bus 502.

The first semiconductor device 510 may include a system clock generation circuit 511 and a data input and output circuit 512. The system clock generation circuit 511 may generate the system clock signal SCLK. The system clock generation circuit 511 may provide the system clock signal SCLK to the second semiconductor device 520 through the clock bus 501. The system clock generation circuit 511 may generate and transmit the system clock signal SCLK along with the complementary system clock signal SCLKB. The system clock generation circuit 511 may include a clock generation circuit, such as a clock oscillator or a phase-locked loop circuit. The system clock generation circuit 511 may generate, from the system clock signal SCLK, a plurality of first internal clock signals INCLK1 having phase differences that are sequentially constant. The clock generation circuit 100, illustrated in FIG. 1, may be applied as at least a part of the system clock generation circuit 511. The data input and output circuit 512 may receive the plurality of first internal clock signals INCLK1 from the system clock generation circuit 511. The data input and output circuit 512 may be electrically coupled to the data bus 502 and may transmit the data DQ through the data bus 502 or receive the data DQ that are transmitted through the data bus 1102. The data input and output circuit 512 may transmit the data DQ to the second semiconductor device 520 in synchronization with the plurality of first internal clock signals INCLK1 or may receive the data DQ that are transmitted by the second semiconductor device 520 in synchronization with the plurality of first internal clock signals INCLK1.

The second semiconductor device 520 may include an internal clock generation circuit 521 and a data input and output circuit 522. The internal clock generation circuit 521 may be electrically coupled to the clock bus 501 and may receive the system clock signal SCLK and the complementary system clock signal SCLKB that are transmitted through the clock bus 501. The internal clock generation circuit 521 may include a delay-locked loop circuit that performs a delay-locked operation on the system clock signal SCLK. The internal clock generation circuit 521 may perform a delay-locked operation on the system clock signal SCLK and may generate a plurality of second internal clock signals INCLK2 having constant phase differences from a delay-locked clock signal. The clock generation circuit 100, illustrated in FIG. 1, may be applied as at least a part of the internal clock generation circuit 521. The data input and output circuit 522 may receive the plurality of second internal clock signals INCLK2 from the internal clock generation circuit 521. The data input and output circuit 522 is electrically coupled to the data bus 502 and may transmit the data DQ through the data bus 502 or may receive the data DQ that are transmitted through the data bus 502. The data input and output circuit 522 may transmit the data DQ to the first semiconductor device 510 in synchronization with the plurality of second internal clock signals INCLK2 or may receive the data DQ that are transmitted by the first semiconductor device 510 in synchronization with the plurality of second internal clock signals INCLK2.

Those skilled in the art to which the present technology pertains may understand that the present technology may be implemented in various other forms without departing from the technical spirit or essential characteristics of the present technology. Accordingly, it is to be understood that the aforementioned embodiments are illustrative from all aspects not being limitative. The scope of the present technology is defined by the appended claims rather than by the detailed description, and all modifications or variations derived from the meanings and scope of the claims and equivalents thereof should be understood as being included in the scope of the present technology.

What is claimed is:

1. A phase detection circuit comprising:
   a division circuit configured to generate a first division clock signal and a second division clock signal by dividing a reference clock signal;
   a clock selection circuit configured to output one of the first and second division clock signals as a division reference clock signal based on an edge detection signal;
   a phase detector group configured to generate a phase detection signal by comparing phases of the division reference clock signal and a feedback clock signal; and
   an edge detector configured to generate the edge detection signal by comparing a phase of a delay feedback clock signal that is generated by delaying the feedback clock signal and the phase of the division reference clock signal.

2. The phase detection circuit of claim 1,
   wherein the division circuit is configured to generate the first and second division clock signals by dividing a frequency of the reference clock signal, and
   wherein the second division clock signal has a phase that is opposite to a phase of the first division clock signal.

3. The phase detection circuit of claim 1, wherein the feedback clock signal has a lower frequency than the division reference clock signal.

4. The phase detection circuit of claim 1, wherein the phase detector group comprises:
   a first phase detector configured to generate a first phase detection signal by comparing the phases of the division reference clock signal and the feedback clock signal during a first phase detection operation; and
   a second phase detector configured to generate a second phase detection signal by comparing the phases of the division reference clock signal and the feedback clock signal during a second phase detection operation.

5. The phase detection circuit of claim 1, further comprising a delay circuit configured to generate the delay feedback clock signal by delaying the feedback clock signal, wherein a delay time of the delay circuit is less than a time corresponding to half a cycle of the division reference clock signal.

6. The phase detection circuit of claim 1, wherein the edge detector is configured to disable the edge detection signal when the division reference clock signal is at a first logic level at a rising edge of the delay feedback clock signal and configured to enable the edge detection signal when the division reference clock signal is at a second logic level at a rising edge of the delay feedback clock signal.

7. The phase detection circuit of claim 6, wherein the clock selection circuit is configured to output the first division clock signal as the division reference clock signal when the edge detection signal is disabled and configured to output the second division clock signal as the division reference clock signal when the edge detection signal is enabled.

8. The phase detection circuit of claim 1, wherein the edge detector further receives a locking signal, wherein the edge detector is configured to disable the edge detection signal when the locking signal is disabled and configured to enable the edge detection signal based on a result of a comparison between the phases of the delay feedback clock signal and the division reference clock signal when the locking signal is enabled.

9. A clock generation circuit comprising:

a delay line configured to generate a delay clock signal by delaying a reference clock signal based on a first delay control signal and a second delay control signal;

a first division circuit configured to generate an output clock signal by dividing a frequency of the delay clock signal;

a second division circuit configured to generate a division output clock signal by dividing a frequency of the output clock signal;

a delay model circuit configured to generate a feedback clock signal by delaying the division output clock signal by a modeled delay time;

a phase detection circuit configured to generate a division reference clock signal by dividing the reference clock signal, to generate a first phase detection signal by comparing phases of the division reference clock signal and the feedback clock signal during a first delay-locked operation, to generate a second phase detection signal by comparing the phases of the division reference clock signal and the feedback clock signal during a second delay-locked operation, and to selectively invert the phase of the division reference clock signal based on the division reference clock signal and the feedback clock signal after the first delay-locked operation is completed; and a delay control circuit configured to generate the first delay control signal based on the first phase detection signal and configured to generate the second delay control signal based on the second phase detection signal.

10. The clock generation circuit of claim 9, wherein the delay line comprises:

a first delay circuit configured to variably delay the reference clock signal based on the first delay control signal; and a second delay circuit configured to generate the delay clock signal by variably delaying an output signal of the first delay circuit based on the second delay control signal.

11. The clock generation circuit of claim 9, wherein the phase detection circuit is configured to generate a delay feedback clock signal by delaying the feedback clock signal and configured to selectively invert the phase of the division reference clock signal by comparing a phase of the delay feedback clock signal and the phase of the division reference clock signal.

12. The clock generation circuit of claim 11, wherein a difference between the phases of the feedback clock signal and the delay feedback clock signal is less than a time corresponding to half a cycle of the division reference clock signal.

13. The clock generation circuit of claim 11, wherein the delay control circuit is configured to change a value of the first delay control signal based on the first phase detection signal during the first delay-locked operation and configured to change a value of the second delay control signal based on the second phase detection signal during the second delay-locked operation.

14. The clock generation circuit of claim 11, wherein the delay control circuit is configured to further generate a locking signal when the first delay-locked operation is completed, and wherein the phase detection circuit is configured to, when the locking signal is enabled, invert the phase of the division reference clock signal based on a result of a comparison between the phases of the delay feedback clock signal and the division reference clock signal.

15. A clock generation method comprising:

generating a division reference clock signal by dividing a reference clock signal;

performing a first delay-locked operation by delaying a phase of the reference clock signal by comparing phases of the division reference clock signal and a feedback clock signal; and selectively inverting, when the first delay-locked operation is completed, the phase of the division reference clock signal by comparing a phase of a delay feedback clock signal, which is generated by delaying the feedback clock signal, and the phase of the division reference clock signal.

16. The clock generation method of claim 15, wherein the feedback clock signal has a lower frequency than the division reference clock signal.

17. The clock generation method of claim 15, wherein the selectively inverting of the phase of the division reference clock signal comprises:

disabling an edge detection signal when the division reference clock signal is at a first logic level at a rising edge of the delay feedback clock signal and enabling the edge detection signal when the division reference clock signal is at a second logic level at a rising edge of the delay feedback clock signal; and maintaining the phase of the division reference clock signal when the edge detection signal is disabled and inverting the phase of the division reference clock signal when the edge detection signal is enabled.

18. The clock generation method of claim 15, wherein a difference between the phases of the feedback clock signal and the delay feedback clock signal is less than a time corresponding to half a cycle of the division reference clock signal.

19. The clock generation method of claim 15, further comprising performing a second delay-locked operation, after the selectively inverting of the phase of the division reference clock signal, by delaying the phase of the reference clock signal by comparing the phases of the division reference clock signal and the feedback clock signal.

20. The clock generation method of claim 19, wherein a unit delay amount by which the reference clock signal is delayed during the second delay-locked operation is less than a unit delay amount by which the reference clock signal is delayed during the first delay-locked operation.

* * * * *